US008547129B2

United States Patent
Huang

(10) Patent No.: US 8,547,129 B2
(45) Date of Patent: Oct. 1, 2013

(54) CONNECTOR TEST SYSTEM

(75) Inventor: Fa-Sheng Huang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 307 days.

(21) Appl. No.: 13/070,473

(22) Filed: Mar. 24, 2011

(65) Prior Publication Data

US 2012/0146681 A1  Jun. 14, 2012

(30) Foreign Application Priority Data

Dec. 8, 2010 (CN) .......................... 2010 1 0579160

(51) Int. Cl.
*G01R 31/00* (2006.01)
(52) U.S. Cl.
USPC ................................ 324/756.05; 324/756.07
(58) Field of Classification Search
USPC ................ 439/55; 29/593; 324/538, 756.07, 324/756.05; 361/772, 777
See application file for complete search history.

(56) References Cited

U.S. PATENT DOCUMENTS

| | | | | |
|---|---|---|---|---|
| 2,221,556 A * | 11/1940 | Roemisch | ...................... | 324/538 |
| 2,493,524 A * | 1/1950 | Bruns | ........................... | 324/525 |
| 2,892,153 A * | 6/1959 | Neill | ............................. | 324/527 |
| 3,471,778 A * | 10/1969 | Plymette et al. | ............... | 324/538 |
| 3,784,910 A * | 1/1974 | Sylvan | ........................... | 324/500 |
| 4,045,735 A * | 8/1977 | Worcester et al. | ............ | 324/537 |
| 4,091,325 A * | 5/1978 | Marcus et al. | ................. | 324/538 |
| 4,298,239 A * | 11/1981 | Montalto et al. | .............. | 439/380 |
| 4,833,404 A * | 5/1989 | Meyer et al. | ............. | 324/756.04 |
| 5,007,846 A * | 4/1991 | Ravid | ............................... | 439/79 |
| 5,010,446 A * | 4/1991 | Scannell | ....................... | 361/749 |
| 5,031,074 A * | 7/1991 | Ravid | ........................... | 361/756 |
| 5,102,342 A * | 4/1992 | Marian | ........................... | 439/65 |
| 5,258,890 A * | 11/1993 | de Veer | ........................ | 361/783 |
| 6,194,908 B1* | 2/2001 | Wheel et al. | ............. | 324/756.04 |
| 6,479,758 B1* | 11/2002 | Arima et al. | ................... | 174/260 |
| 6,517,360 B1* | 2/2003 | Cohen | ............................. | 439/65 |
| 6,607,402 B2* | 8/2003 | Cohen et al. | ............. | 439/607.11 |
| 6,617,841 B2* | 9/2003 | Thao | ........................ | 324/763.01 |
| 6,719,594 B1* | 4/2004 | Yuzawa | ........................ | 439/862 |
| 6,734,683 B2* | 5/2004 | Hash | ............................ | 324/538 |

(Continued)

FOREIGN PATENT DOCUMENTS

CN   201010579160 A  * 12/2010
EP         907225 A2 *  4/1999

OTHER PUBLICATIONS

TE Connectivity, Fortis Zd 3 Pair 10 Column Minibox Right Angle Left Module Assembly, Jun. 24, 2009.*

(Continued)

*Primary Examiner* — Patrick Assouad
*Assistant Examiner* — Marcus D Guevara
(74) *Attorney, Agent, or Firm* — Altis & Wispro Law Group, Inc.

(57) ABSTRACT

A connector test system includes a number of adapters, a number of testers, and a motherboard. Each tester is connected to a corresponding one of the adapters. The motherboard is configured for connecting to the connector. The motherboard includes a number of pins arrayed in a 9 by 10 matrix. The pins includes a number of signal input pins and a number of grounding pins, each signal input pin is connected to a corresponding adapter.

10 Claims, 8 Drawing Sheets

(56) References Cited

U.S. PATENT DOCUMENTS

| | | | |
|---|---|---|---|
| 6,739,918 B2 * | 5/2004 | Cohen et al. | 439/701 |
| 6,769,935 B2 * | 8/2004 | Stokoe et al. | 439/607.1 |
| 6,786,771 B2 * | 9/2004 | Gailus | 439/607.01 |
| 6,833,513 B1 * | 12/2004 | Ahmad | 174/262 |
| 6,895,353 B2 * | 5/2005 | Barr et al. | 702/117 |
| 6,956,387 B2 * | 10/2005 | Ho et al. | 324/756.05 |
| 6,963,209 B1 * | 11/2005 | Gailus et al. | 324/750.02 |
| 7,139,177 B2 * | 11/2006 | Gottlieb | 361/788 |
| 7,279,915 B2 * | 10/2007 | Cram | 324/754.08 |
| 7,388,391 B2 * | 6/2008 | Renfrow | 324/754.03 |
| 7,511,526 B2 * | 3/2009 | Munt et al. | 324/756.02 |
| 7,746,090 B1 * | 6/2010 | Sip | 324/762.06 |
| 7,791,360 B2 * | 9/2010 | Fukushima et al. | 324/754.07 |
| 7,914,305 B2 * | 3/2011 | Amleshi et al. | 439/101 |
| 8,232,480 B2 * | 7/2012 | Liu | 174/261 |
| 8,251,708 B2 * | 8/2012 | Huang | 439/54 |
| 8,379,403 B2 * | 2/2013 | Waite et al. | 361/777 |
| 8,382,522 B2 * | 2/2013 | Glover et al. | 439/607.08 |
| 2006/0068640 A1 * | 3/2006 | Gailus | 439/608 |
| 2006/0082377 A1 * | 4/2006 | Bolouri-Saransar et al. | 324/538 |
| 2006/0226853 A1 * | 10/2006 | Wang et al. | 324/537 |
| 2008/0245566 A1 * | 10/2008 | Li et al. | 174/84 C |
| 2009/0011644 A1 * | 1/2009 | Amleshi et al. | 439/608 |
| 2009/0011645 A1 * | 1/2009 | Laurx et al. | 439/608 |
| 2009/0017681 A1 * | 1/2009 | Amleshi et al. | 439/608 |
| 2009/0212802 A1 * | 8/2009 | Cartier, Jr. | 324/755 |
| 2009/0230976 A1 * | 9/2009 | McElfresh et al. | 324/538 |
| 2009/0256582 A1 * | 10/2009 | Sung | 324/755 |
| 2010/0207651 A1 * | 8/2010 | Suto | 324/754 |
| 2010/0235693 A1 * | 9/2010 | Kang et al. | 714/718 |
| 2011/0210759 A1 * | 9/2011 | Suto | 324/754.03 |

OTHER PUBLICATIONS

Molex Incorporated, Tinman 3 Pair 85 Ohm Right Angle Receptacle 10 Column Sales Assembly, Feb. 3, 2011.*

* cited by examiner

FIG. 2
(RELATED ART)

|   | 01 | 02 | 03 | 04 | 05 | 06 |
|---|---|---|---|---|---|---|
| I | $GND_{RG}$ | $HS8\_BA-_{HS}$ | $GND_{RG}$ | $STANDBY\_PWR_{LS}$ | $GND_{RG}$ | $HS7\_AB-_{HS}$ |
| H | $LS8-BA_{LS}$ | $HS8\_BA+_{HS}$ | $HS8\_AB-_{HS}$ | $AC-GOOD\_L_{LS}$ | $HS7\_BA-_{HS}$ | $HS7\_AB+_{HS}$ |
| G | $LS8-AB_{LS}$ | $GND_{LG}$ | $HS8\_AB+_{HS}$ | $GND_{LG}$ | $HS7\_BA+_{HS}$ | $GND_{LG}$ |
| F | $GND_{LG}$ | $HS5\_BA-_{HS}$ | $GND_{LG}$ | $HS3\_BA-_{HS}$ | $GND_{LG}$ | $HS1\_BA-_{HS}$ |
| E | $HS6\_BA-_{HS}$ | $HS5\_BA+_{HS}$ | $HS4\_BA-_{HS}$ | $HS3\_BA+_{HS}$ | $HS2\_BA-_{HS}$ | $HS1\_BA+_{HS}$ |
| D | $HS6\_BA+_{HS}$ | $GND_{RG}$ | $HS4\_BA+_{HS}$ | $GND_{RG}$ | $HS2\_BA+_{HS}$ | $GND_{RG}$ |
| C | $GND_{RG}$ | $HS5\_AB-_{HS}$ | $GND_{RG}$ | $HS3\_AB-_{HS}$ | $GND_{RG}$ | $HS1\_AB-_{HS}$ |
| B | $HS6\_BA-_{HS}$ | $HS5\_AB+_{HS}$ | $HS4\_AB-_{HS}$ | $HS3\_AB+_{HS}$ | $HS2\_AB-_{HS}$ | $HS1\_AB+_{HS}$ |
| A | $HS6\_BA+_{HS}$ | $GND_{RG}$ | $HS4\_AB+_{HS}$ | $GND_{RG}$ | $HS2\_AB+_{HS}$ | $GND_{RG}$ |

FIG. 3
(RELATED ART)

CONNECTOR TEST SYSTEM

BACKGROUND

1. Technical Field

The disclosure relates to test systems and, particularly, to a connector test system for testing Storage Bridge Bay Midplane Interconnect (SBBMI) connectors.

2. Description of Related Art

The Storage Bridge Bay (SBB) working group is a non-profit corporation formed by industry members to develop and distribute specification standardizing of storage enclosures. An SBB specification defines an SBB Midplane Interconnect (SBBMI) connector for connecting storage control cards to storage units, such as hard disks. The storage control card exchanges information with the storage unit by the SBBMI connector.

During manufacturing, signal transmissions of the SBBMI connector are usually tested using a tool, such as an oscilloscope or a multimeter. The SBBMI connector has a number of pins. Because the connectors are often very small, it is not convenient to test all of the pins at one time. Many methods require multiple testers for separately testing the pins of the SBBMI connector. When testing one of the high-frequency signal output pins, the other high-frequency signal output pins are not grounded, which may interfere with testing and produce inaccurate results.

What is needed, therefore, is a test system to overcome the above-described problem.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure.

FIG. 2 is a schematic view of pins of a connector to be tested by the connector test system of FIG. 1.

FIG. 3 is a table of definition of pins of FIG. 2.

DETAILED DESCRIPTION

Embodiments of the disclosure will now be described in detail below, with reference to the accompanying drawings.

Figure 1:
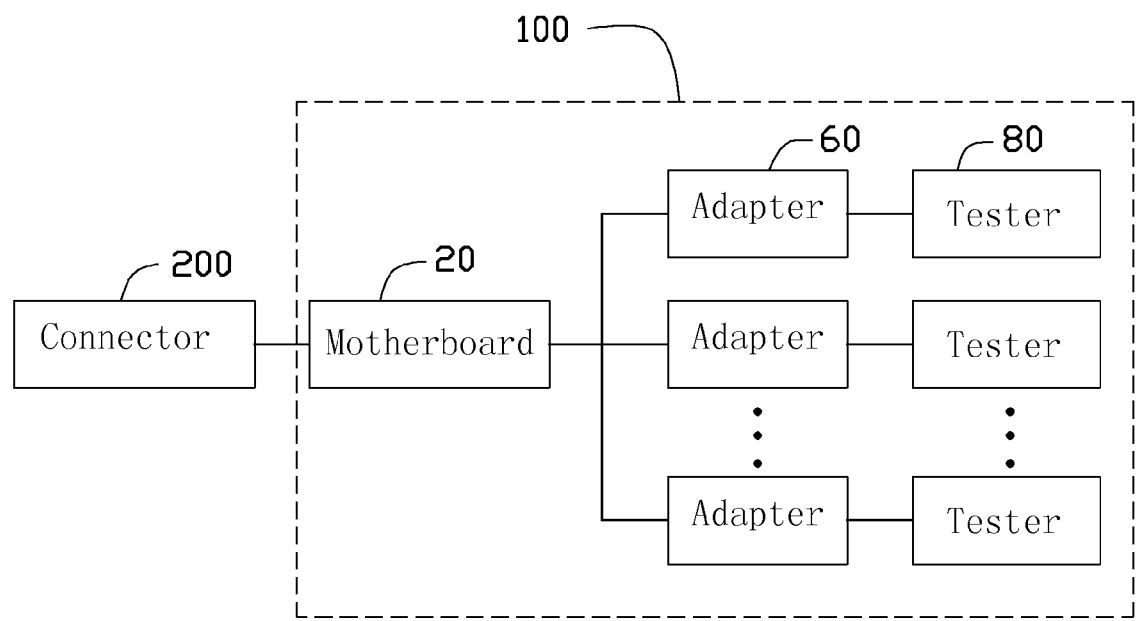
FIG. 1 is a functional block diagram of a connector test system in accordance with an exemplary embodiment.
Figure 2:
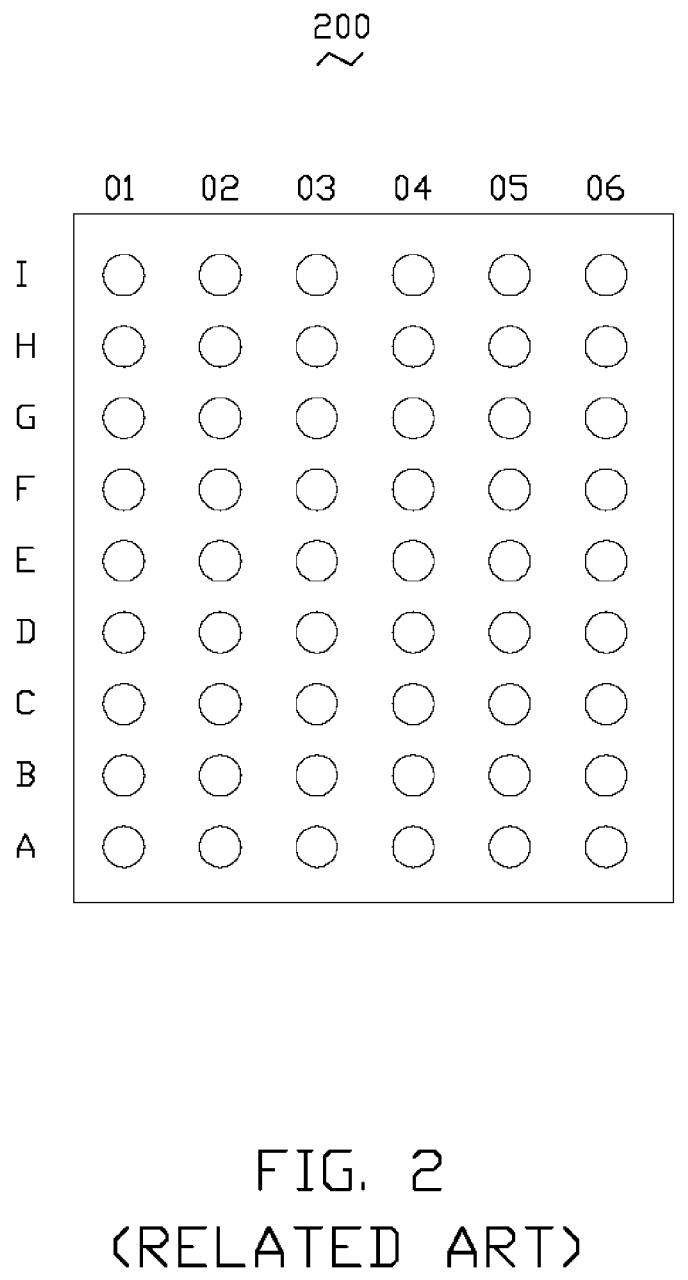

Referring to FIGS. 1-2, a connector test system 100 is used for testing a Storage Bridge Bay Midplane Interconnect (SBBMI) connector 200. The connector 200 includes a number of pins arrayed in a 9*6 matrix. The 9 rows are labeled A-I; the 6 columns are labeled 01-06; the pins are labeled according to row and column they intersect, such as pin A01 is at the intersection of row A column 01. The pins are divided into 15 pairs and identified as follows: A01/B01, D01/E01, B02/C02, E02/F02, H02/I02, A03/B03, D03/E03, G03/H03, B04/C04, E04/F04, A05/B05, D05/E05, G05/H05, B06/C06, and E06/F06 are used when connecting two storage cards together. 12 pairs of pins identified as D01/E01, G01/H01, E02/F02, H02/I02, D03/E03, G03/H03, E04/F04, H04/I04, D05/E05, G05/H05, E06/F06, and H06/I06 are used when connecting a storage control card to a hard disk. FIG. 3 shows a table of definitions for the pins of the connector 200. In this embodiment, pins include grounding pins labeled GND, high-frequency signal output pins labeled HS; and low-frequency signal output pin labeled LS.

The test system 100 includes a motherboard 20, a number of adapters 60, and a number of testers 80. The connector 200 is detachably engaged with the motherboard 20, and the motherboard 20 is also electrically connected to the adapters 60. There are equal numbers of testers 80 and adapters 60. In the embodiment, there are twelve each of the testers 80 and the adapters 60.

Figure 4:
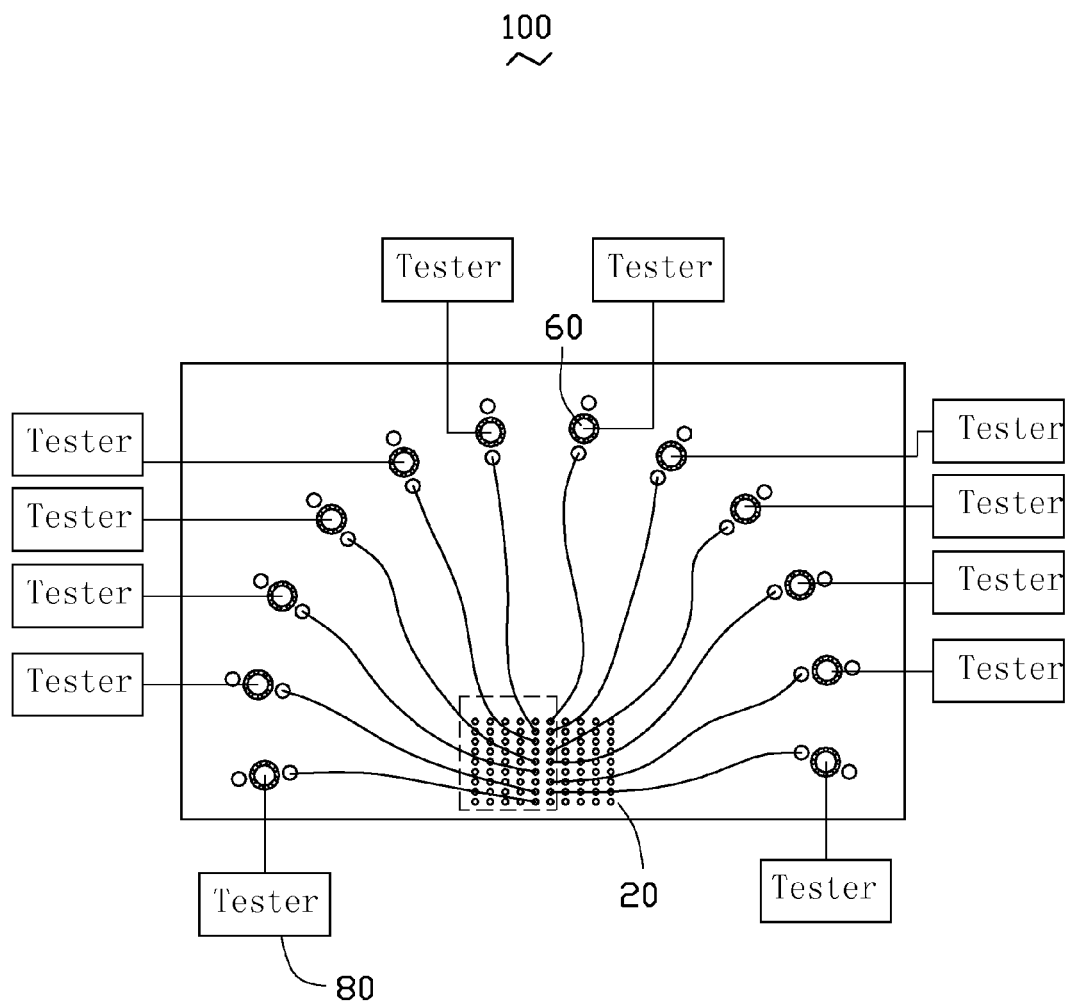
FIG. 4 is a schematic view of the connector test system of FIG. 1.
Figure 5:
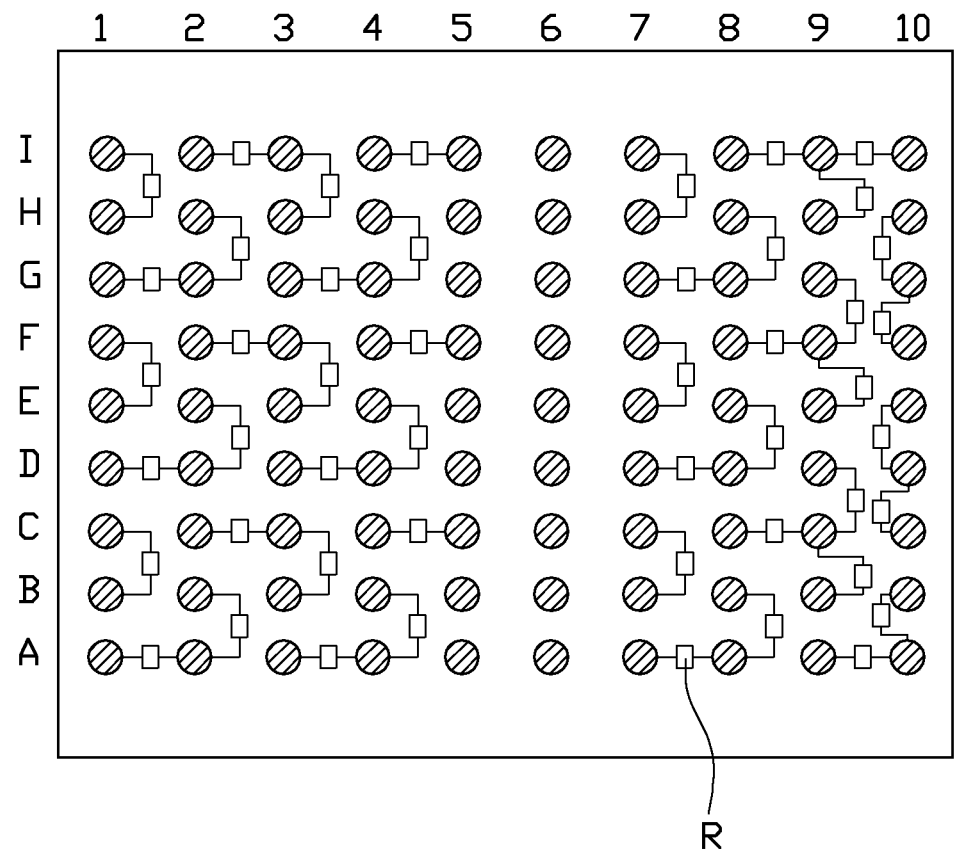
FIG. 5 is a schematic view of pins of a motherboard of the connector of FIG. 4.

Also referring to FIGS. 4 and 5, the motherboard 20 is a printed circuit board. The motherboard 20 includes a number of pins arrayed in a 9*10 matrix. The 9 rows are labeled A-I; the 10 columns are labeled 1-10; and the pins are identified according to the corresponding row and column they intersect, such as the pin A1 is at the intersection of row A and column 1. The pins A5, B5, D5, E5, G5, H5, B6, C6, E6, F6, H6, and I6 are signal input pins, with each signal input pin connected to a different one of the adapters 60; the pins C1, F1, I1, A2, D2, G2, C3, F3, I3, A4, D4, G4, C5, F5, I5, A6, D6, G6, C7, F7, I7, A8, D8, G8, C9, F9, I9, A10, D10, and G10 are grounding pins; and the rest of the pins A1, B1, D1, E1, G1, H1, B2, C2, E2, F2, H2, I2, A3, B3, D3, E3, G3, H3, B4, C4, E4, F4, H4, I4, A7, B7, D7, E7, G7, H7, B8, C8, E8, F8, H8, I8, A9, B9, D9, E9, G9, H9, B10, C10, E10, F10, H10, and I10 of the motherboard 20 are respectively connected to the corresponding grounded pins C1, F1, I1, A2, D2, G2, C3, F3, I3, A4, D4, G4, C5, F5, I5, C7, F7, I7, A8, D8, G8, C9, F9, I9, A10, D10, and G10 by a resistance R to become grounded pins. In the embodiment, the resistance R is 50 ohms.

In the embodiment, the twelve adapters 60 are respectively connected to the signal input pins A5, B5, D5, E5, G5, H5, B6, C6, E6, F6, H6, and I6 of the motherboard 20. High-frequency signals output by the high-frequency output pins of the connector 200 are respectively transmitted to the adapters 60 by the signal input pins A5, B5, D5, E5, G5, H5, B6, C6, E6, F6, H6, and I6 of the motherboard 20. The tester 80 may be an oscilloscope or a multimeter. Each tester 80 is connected to a corresponding adapter 60 for outputting the test results of the connector 200.

During use of the test system 100, to connect the connector 200 to the tester 80, the pins of the connector 200 are divided into three groups. The first group of pins includes A01/B01, D01/E01, G01/H01, B02/C02, E02/F02, and H02/I02. The second group of pins includes A03/B03, D03/E03, G03/H03, B04/C04, E04/F04, and H04/I04. The third group of pins includes A05/B05, D05/E05, G05/H05, B06/C06, E06/F06, and H06/I06.

Figure 6:
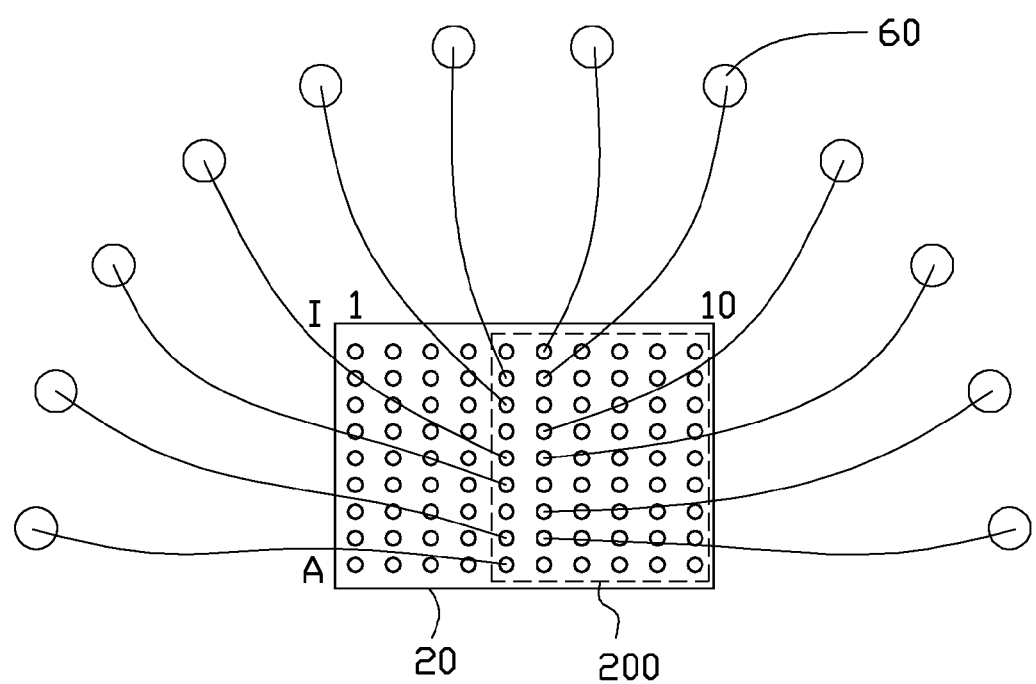
FIGS. 6-8 are respective schematic views of the motherboard and the connector, when testing a first group, a second group, and a third group of pins of the connector using the connector test system of FIG. 1.

Referring to FIG. 6, to test the first group of pins, the connector 200 placed to receive the corresponding pins of the motherboard 20, which are the pins arrayed in the columns 5-10 of the motherboard 20. Therefore, high-frequency signals output by the high-frequency signal output pins A01/B01, D01/E01, B02/C02, E02/F02 and H02/I02, and low-frequency signals output by the low-frequency signal output pins G01/H01 of the first group the connector 200 can be respectively transmitted to the pins A5, B5, D5, E5, G5, H5, B6, C6, E6, F6, H6, and I6 of the motherboard 20, and output to the testers 80 by the adapters 60. High-frequency signals output by the high-frequency signal output pins A03/B03, D03/E03, G03/H03, B04/C04, E04/F04, A05/B05, D05/E05, G05/H05, B06/C06, E06/F06, H06/I06, A05/B05, D05/E05, G05/H05, B06/C06, E06/F06, H06/I06, and low-frequency signals output by the low-frequency signal output pins G01/H01 of the second group and the third group of the connector 200 are grounded, because the high-frequency signal output pins A03/B03, D03/E03, G03/H03, B04/C04, E04/F04, A05/B05, D05/E05, G05/H05, B06/C06, E06/F06, H06/I06, A05/B05, D05/E05, G05/H05, B06/C06, E06/F06 and H06/I06 and low-frequency signal output pins G01/H01 of the second group and the third group of the connector 200 are respectively connected to the grounded pins of A7, B7, D7, E7, G7, H7, B8, C8, E8, F8, H8, I8, A9, B9, D9, E9, G9, H9, B10, C10, E10, F10, H10, and I10 of the motherboard 20.

Figure 7:
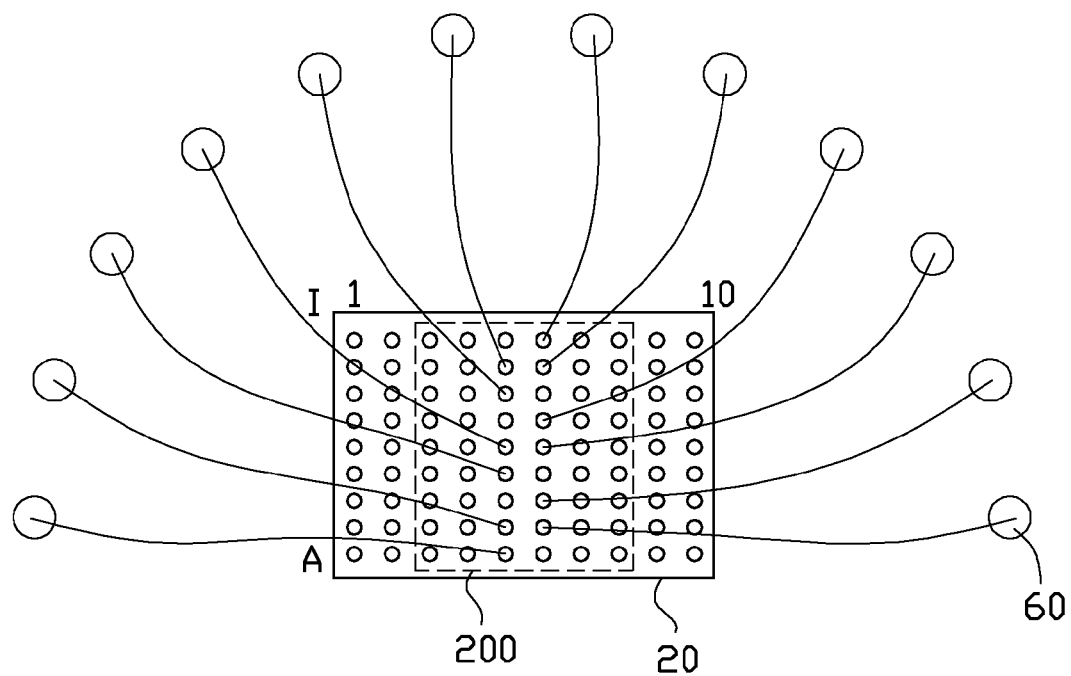

Referring to FIG. 7, to test the second group of pins, the connector 200 is placed to receive the corresponding pins of the motherboard 20, which are the pins arrayed in the columns 3-8 of the motherboard 20. Therefore, high-frequency signals output by the high-frequency signal output pins A03/B03, D03/E03, G03/H03, B04/C04 and E04/F04, and low-frequency signal output pins H04/I04 of the second group of the connector 200 can be respectively transmitted to the pins A5, B5, D5, E5, G5, H5, B6, C6, E6, F6, H6, and I6 of the motherboard 20, and output to the testers 80 by the adapters 60. High-frequency signals output by the high-frequency signal output pins A01/B01, D01/E01, B02/C02, E02/F02, H02/I02, A05/B05, D05/E05, G05/H05, B06/C06, E06/F06, H06/I06 and low-frequency signals output by the low-frequency signal output pins G01/H01 of the first group and the third group of the connector 200 are grounded, because the high-frequency signal output pins A01/B01, D01/E01, B02/C02, E02/F02, H02/I02, A05/B05, D05/E05, G05/H05, B06/C06, E06/F06, H06/I06 and low-frequency signal output pins G01/H01 of the first group and the third group of the connector 200 are respectively connected to the grounding pins of A3, B3, D3, E3, G3, H3, B4, C4, E4, F4, H4, I4, A7, B7, D7, E7, G7, H7, B8, C8, E8, F8, H8, I8 of the motherboard 20.

Figure 8:
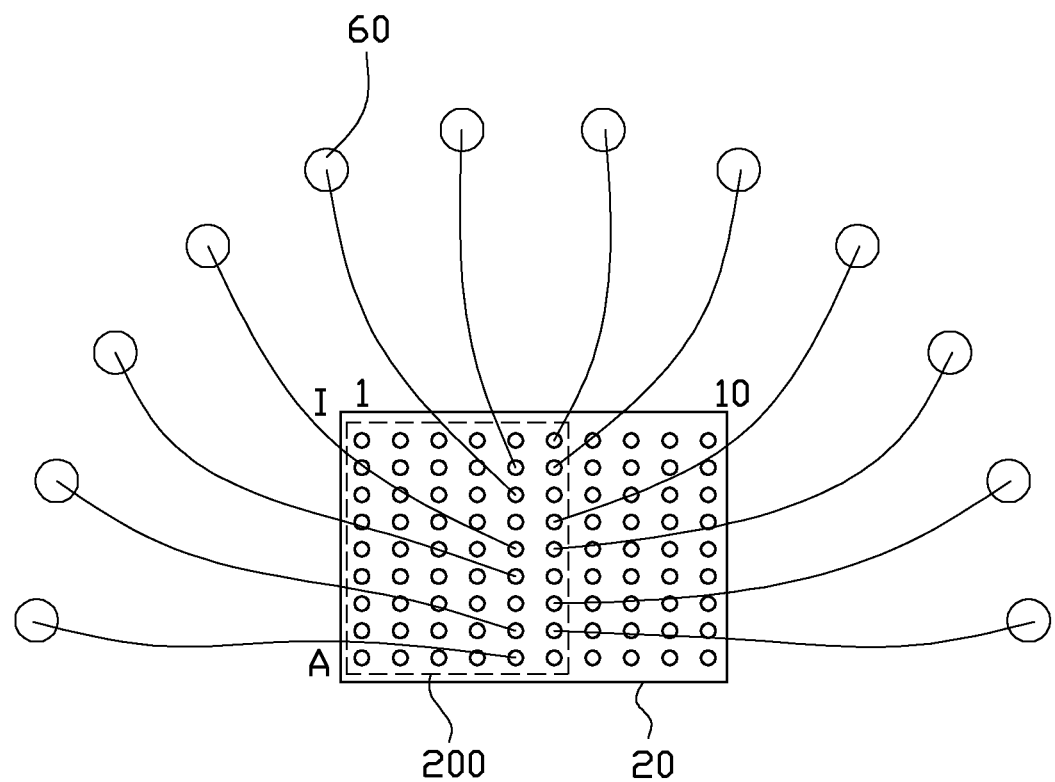

Referring to FIG. 8, to test the third group of pins, the connector 200 is placed to receive the corresponding pins of the motherboard 20, which are the pins arrayed in the columns 1-6. Therefore, high-frequency signals output by the high-frequency signal output pins A05/B05, D05/E05, G05/H05, B06/C06, E06/F06, H06/I06 of the third group of the connector 200 can be transmitted to the pins A5, B5, D5, E5, G5, H5, B6, C6, E6, F6, H6, and I6 of the motherboard 20, and are respectively output to the testers 80 by the adapters 60. High-frequency signals output by the high-frequency signal output pins A01/B01, D01/E01, B02/C02, E02/F02, H02/I02, A03/B03, D03/E03, G03/H03, B04/C04, E04/F04 and low-frequency signals output by the low-frequency signal output pins G01/H01, H04/I04 of the first group and the second group of the connector 200 are grounded, because the high-frequency signal output pins A01/B01, D01/E01, B02/C02, E02/F02, H02/I02, A03/B03, D03/E03, G03/H03, B04/C04, E04/F04 and low-frequency signal output pins G01/H01, H04/I04 of the first group and the second group of the connector 200 are respectively connected to the grounding pins of A1, B1, D1, E1, G1, H1, B2, C2, E2, F2, H2, I2, A3, B3, D3, E3, G3, H3, B4, C4, E4, F4, H4, I4 of the motherboard 20.

The signal input pins A5, B5, D5, E5, G5, H5, B6, C6, E6, F6, H6, and I6 of the motherboard 20 are each connected to a different one of the adapters 60. The adapters 60 output signals of all high-frequency signals output pins of the connector 200 to the testers 80 by connecting to the high-frequency signal output pins in different columns of the motherboard 20. Therefore, the test process is simple. In addition, when testing one group of the pins of the connector 200, the high-frequency signal output pins of the other two groups of pins are grounded, which can prevent them from crosstalk interfering with the testers 80, and improve the accuracy of the test.

While certain embodiments have been described and exemplified above, various other embodiments will be apparent to those skilled in the art from the foregoing disclosure. The disclosure is not limited to the particular embodiments described and exemplified, and the embodiments are capable of considerable variation and modification without departure from the scope of the appended claims.

What is claimed is:

1. A connector test system for testing a connector, comprising:
   a plurality of adapters;
   a plurality of testers, each tester being connected to a corresponding one of the adapters; and
   a motherboard configured for connecting to the connector, the motherboard comprising a plurality of pins arrayed in a 9 by 10 matrix, the pins comprising a plurality of signal input pins and a plurality of grounding pins, each signal input pin being connected to a corresponding adapter.

2. The connector test system of claim 1, wherein the pins comprises 12 signal input pins, 30 first grounding pins, and 48 second grounding pins, each second grounding pin is connected to a corresponding first grounding pin.

3. The connector test system of claim 2, wherein 28 of the 30 first grounding pins are connected to the second grounding pins.

4. The connector test system of claim 2, wherein the motherboard comprises a plurality of resistances, each second grounding pin is connected to the corresponding first grounding pin through one of the resistances.

5. The connector test system of claim 4, wherein each resistance is 50 ohms.

6. The connector test system of claim 1, wherein each tester is an oscilloscope.

7. The connector test system of claim 1, wherein each tester is a multimeter.

8. The connector test system of claim 1, wherein the number of the testers is equal to that of the adapters.

9. The connector test system of claim 8, comprising twelve testers and twelve adapters.

10. The connector test system of claim 1, wherein the motherboard is a printed circuit board.

* * * * *